(12) United States Patent
Jaussi et al.

(10) Patent No.: US 7,301,391 B2
(45) Date of Patent: *Nov. 27, 2007

(54) FILTERING VARIABLE OFFSET AMPLIFIER

(75) Inventors: James E. Jaussi, Hillsboro, OR (US); Bryan K. Casper, Hillsboro, OR (US); Aaron K. Martin, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 176 days.

This patent is subject to a terminal disclaimer.

(21) Appl. No.: 11/181,380

(22) Filed: Jul. 14, 2005

(65) Prior Publication Data

US 2006/0036668 A1 Feb. 16, 2006

Related U.S. Application Data

(63) Continuation of application No. 10/626,491, filed on Jul. 24, 2003, now Pat. No. 6,946,902, which is a continuation of application No. 10/041,677, filed on Jan. 7, 2002, now Pat. No. 6,624,688.

(51) Int. Cl.
*H03F 3/45* (2006.01)
*H03K 5/22* (2006.01)

(52) U.S. Cl. .................. 327/552; 327/307; 327/361; 455/307

(58) Field of Classification Search .................. None
See application file for complete search history.

(56) References Cited

U.S. PATENT DOCUMENTS

| 3,916,333 | A | 10/1975 | Zuk | 330/259 |
|---|---|---|---|---|
| 4,647,839 | A | 3/1987 | Siligoni et al. | 323/312 |
| 4,754,169 | A | 6/1988 | Morris | 327/307 |
| 4,797,586 | A | 1/1989 | Traa | 327/276 |
| 4,805,129 | A | 2/1989 | David | 708/300 |
| 4,987,327 | A | 1/1991 | Fernandez et al. | 327/543 |
| 5,079,515 | A | 1/1992 | Tanimoto | 330/256 |
| 5,148,162 | A | 9/1992 | Crosby | 341/122 |
| 5,222,240 | A | 6/1993 | Patel | 712/218 |
| 5,367,476 | A | 11/1994 | Elliott | 708/301 |
| 5,408,235 | A | 4/1995 | Doyle et al. | 341/143 |
| 5,414,311 | A | 5/1995 | Carley | 327/94 |
| 5,500,811 | A | 3/1996 | Corry | 708/319 |
| 5,563,598 | A | 10/1996 | Hickling | 341/155 |
| 5,717,716 | A | 2/1998 | Doyle | 375/232 |
| 5,777,912 | A | 7/1998 | Leung et al. | 708/319 |

(Continued)

OTHER PUBLICATIONS

Farjad-Rad et al., "A 0.3- μm CMOS 8-Gb/s 4-PAM Serial Link Transceiver," *IEEE*, May 2000, 35(5):757-764.

*Primary Examiner*—Kenneth B. Wells
*Assistant Examiner*—Terry L. Englund
(74) *Attorney, Agent, or Firm*—Fish & Richardson P.C.

(57) ABSTRACT

A current summing FIR filter can be implemented with multiple differential input stages and variable tail currents. The variable tail currents can be used to appropriately weight the present and previous digital input signals. The weighted outputs of the differential transistor pairs can be summed to provide a filtered output signal. The tail currents can be advantageously varied with variable current sources or by adjustment of the relative widths of the differential transistor pairs. In other embodiments, additional differential pairs can be added to adjust for systematic offset voltages caused by process-induced variations in the structure of circuit devices or to induce a desired offset.

20 Claims, 6 Drawing Sheets

U.S. PATENT DOCUMENTS

| | | | |
|---|---|---|---|
| 5,900,779 A | 5/1999 | Giacomini | 330/252 |
| 5,903,605 A | 5/1999 | Crittenden | 375/226 |
| 5,966,314 A | 10/1999 | Lee | 708/319 |
| 6,018,269 A | 1/2000 | Viswanathan | 330/254 |
| 6,064,614 A | 5/2000 | Khoury | 365/207 |
| 6,151,415 A | 11/2000 | Acharya et al. | 382/255 |
| 6,163,215 A | 12/2000 | Shibata et al. | 330/254 |
| 6,209,069 B1 | 3/2001 | Baltar | 711/163 |
| 6,275,835 B1 | 8/2001 | Pisek et al. | 708/300 |
| 6,288,588 B1 | 9/2001 | Frisch | 327/280 |
| 6,348,882 B1 | 2/2002 | Ciccone et al. | 341/56 |
| 6,388,521 B1 | 5/2002 | Henry | 330/258 |
| 6,396,329 B1 | 5/2002 | Zerbe | 327/336 |
| 6,400,225 B1 * | 6/2002 | Kruiskamp | 330/253 |
| 6,420,932 B1 | 7/2002 | Casper | 330/258 |
| 6,469,576 B2 | 10/2002 | Hasegawa | 330/69 |
| 6,624,688 B2 * | 9/2003 | Jaussi et al. | 327/552 |
| 6,946,902 B2 * | 9/2005 | Jaussi et al. | 327/552 |

\* cited by examiner

FILTERING VARIABLE OFFSET AMPLIFIER

CROSS-REFERENCE TO RELATED APPLICATION

This application is a continuation of U.S. patent application Ser. No. 10/626,491, filed Jul. 24, 2003, now issued as U.S. Patent No. 6,946,902, which is a continuation of U.S. patent application Ser. No. 10/041,677, filed Jan. 7, 2002, now issued as U.S. Patent No. 6,624,688, the complete disclosures of which are incorporated herein by reference.

TECHNICAL FIELD

The invention relates to devices for filtering digital and analog signals and, more specifically, to Finite Impulse Response (or FIR) filters.

BACKGROUND

Digital signals preferably have relatively sharp, square wave forms representing two or more logic levels. However, line capacitance, noise and the like can cause attenuation of the digital signals and a corresponding "rounding" of the sharp transitions between logic levels. Accordingly, upon receipt of a digital signal it is often desirable to restore the signals to their original shape by de-attenuating the signal.

Similarly, analog signals are often attenuated during transmission. In a variety of applications, it is necessary or desirable to restore analog signals to their pre-transmission waveforms prior to further signal processing.

Finite impulse response (FIR) filters are widely used for various applications. One application is a discrete linear equalizer, which is used to de-attenuate digital and analog signals in communications systems and integrated circuits. Linear equalizers can be used to restore a signal by taking N samples of the signal over a discrete time window, multiplying each successive input sample $X_i$ by a weighting coefficient $A_i$, and outputting the sum of the products. The successive data outputs of an FIR filter is calculated as $Y_1 = \sum_{i=1}^{N} A_i X_i$ $Y_2 = \sum_{i=1}^{N} A_i X_{i+1}$ $Y_3 = \sum_{i=1}^{N} A_i X_{i+2}$ and so on. The variable N accordingly defines the number of "stages" in the FIR filter. When N=3, an FIR filter weighs the current signal against two previously received signals and outputs a weighted average digital signal. Optionally, successive samples can be included in the weighted average.

The digital signal filtering accomplished by such weighted averaging can be readily appreciated by considering a 5V digital source signal comprising data points 0V, 0V, 0V, 5V. During transmission, that signal attenuates and becomes, in a simplified example, 0V, 0V, 2.5V, 5V. A three stage FIR filter, upon receiving the 2.5V data point, can combine that data point with the weighted products of the two previously received data points. The FIR output will be less than 2.5V by a factor dictated by the weighting constants, and the attenuation of the signal will be thereby counteracted. By appropriate selection of the weighting constants $A_i$ and appropriate post-filtration amplification, the attenuated signal can be restored to its original waveform, or 0V, 0V, 0V, 5V.

Early FIR filters were implemented with shift register delay lines that accepted analog input signals. Samples of the analog signals were tapped at various points along the shift registers and the samples were weighted and summed as explained above to provide the desired output. Another approach to FIR filtration involves storing successive analog samples in sample and hold cells and applying tap weights with MDAC's (multiplying digital to analog converters) and associated shift registers that store the weighting constant operands.

A more recent approach has been to store the weighting constants and input data points in random access memory, or RAM. The constants and data points are output to a multiplier. The first product is sent to an accumulator and the next product is sent to an adder to be added to the contents of the accumulator, after which the resulting sum is returned to the accumulator. The process repeats until a pre-selected number of products are summed, at which time the contents of the accumulator are output as a filtered data point.

DESCRIPTION OF DRAWINGS

Like reference symbols in the various drawings indicate like elements.

DETAILED DESCRIPTION

A current summing FIR filter can be implemented with multiple differential input stages and variable tail currents. The variable tail currents can be used to appropriately weight the present and previous digital input signals. The weighted outputs of the differential transistor pairs can be summed to provide a filtered output signal. The tail currents can be advantageously varied with variable current sources or by adjustment of the relative widths of the differential transistor pairs. In other embodiments, additional differential pairs can be added to adjust for systematic offset voltages caused by process-induced variations in the structure of circuit devices or to induce a desired offset.

Figure 1:
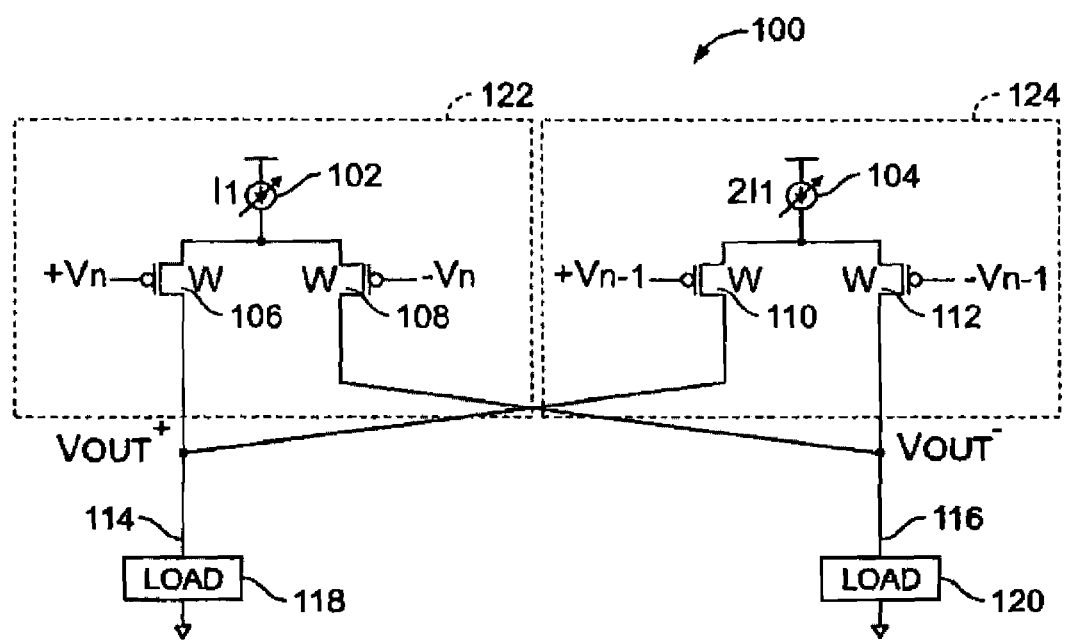
FIG. 1 is a schematic diagram of a two stage FIR filter.

FIG. 1 shows an embodiment of a differential input pair FIR filter. The filter circuit 100 includes a first differential transistor pair 106, 108 in a first stage 122 and a second differential transistor pair 110, 112 in a second stage 124. Each transistor has a channel of width W. The length of the transistor channels may be the same across all transistors in the circuit. The first and second transistor pairs can be referred to as being inter-coupled to each other because output node 114 is coupled to an output of transistor 110 from the second pair, while the output node 116 is coupled to an output node of transistor 108 from the first pair. Output nodes 114 and 116 are respectively coupled to load devices 118 and 120. These load devices can include passive and/or active circuits, depending on the application of the filter circuit. The load devices can alternatively represent a separate filter or amplification stage. The respective tail currents of the differential pairs are controlled by variable current generators 102 and 104 as shown. Other types of variable current generators to control the tail currents can alternatively be used, for example, current sinks. In this embodiment, variable current generator 102 provides half the current of current generator 104. The inputs to the gates of transistors 106, 108, 110, and 112 are $V_n^+$, $V_n^-$, $V_{n-1}^+$, and $V_{n-1}^-$, respectively, where n represents a current differential signal data point and n−1 represents the previous differential signal data point.

In operation, the inputs $V_n^+$, $V_n^-$, $V_{n-1}^+$, and $V_{n-1}^-$ are provided by, for example, an sample and hold circuit (not shown). The fact that the tail current set by generator 104 is twice that set by generator 102 dictates that the current gain for inputs $V_{n-1}^+$ and $V_{n-1}^-$ will be twice that of inputs $V_n^+$, $V_n^-$. The filter circuit 100 provides output voltages $V_{out}^+$ at node 114 and $V_{out}^-$ at node 116. The output voltages will reflect a weighting of signals n and n−1 consistent with their relative current amplification. Stated another way, in this embodiment differential input signals $V_{n-1}^+$ and $V_{n-1}^-$ are given twice the weight of differential inputs $V_n^+$, $V_n^-$.

The circuit of FIG. 1 thus serves as an FIR filter when tapped at the outputs 114, 116. The filtered output for differential signal sample n is either suppressed or amplified based on the previously received differential signal sample.

Various modifications can be readily made to the circuit of FIG. 1 to expand its functionality. Additional stages can be added to the filter to provide that input signals n−2, n−3, n+1, n+2, et cetera be factored into the filtered output $V_{out}^+$ and $V_{out}^-$. The weight afforded each input pair can be adjusted by appropriate variation of the tail current generators 102 and 104. The use of matrices to select optimal weighting coefficients is well known in the art and will not be discussed in further detail herein. Many other modifications can be made to the circuit 100, as is explained in greater detail below.

Figure 2:
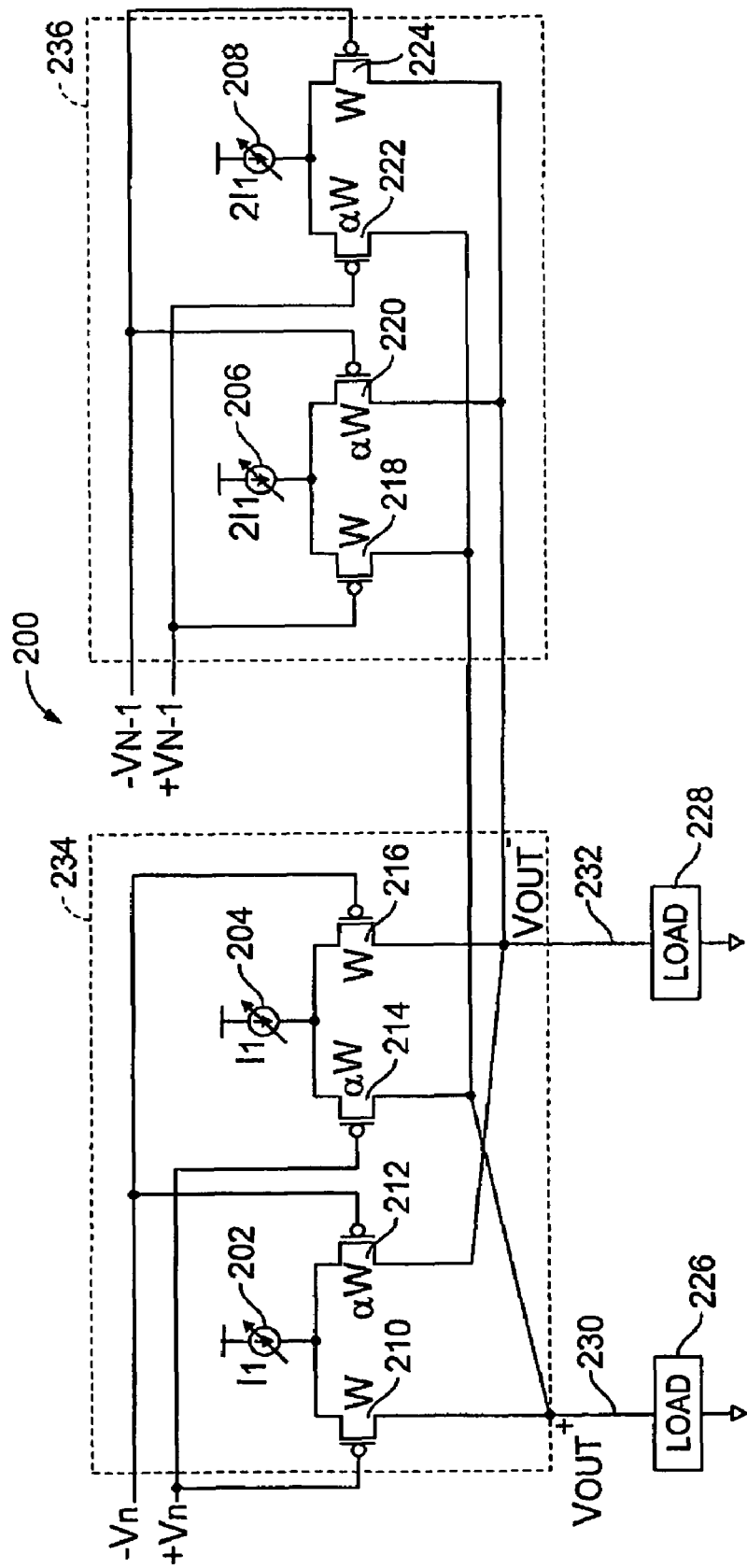
FIG. 2 is a schematic diagram of a two stage FIR filter adapted to compensate for amplifier offset.

FIG. 2 shows a filter circuit 200 that corrects for an undesired differential signal offset or provides for a desired signal offset. The embodiment of the filter circuit 200 shown in FIG. 2 is implemented using p-channel metal oxide semiconductor field effect transistors (MOSFETs), as with the circuit 100 shown in FIG. 1. The filter circuit 200 of FIG. 2 has two stages, like the filter circuit 100 of FIG. 1. However, each stage 234, 236 of the circuit 200 includes two differential transistor pairs instead of one differential transistor pair.

The first stage 234 includes variable current generator 202, which provides a tail current to transistor pair 210, 212, and a complementary current generator 204, which provides a tail current to transistor pair 214, 216. When the current of generator is 202 is increased by $\Delta I$, the current of generator 204 is decreased by $\Delta I$, and visa versa. The input to the gates of transistors 210 and 214 is $V_n^+$ and the input to the gates of transistors 212 and 216 is $V_n^-$. The widths of the gates of transistors 212 and 214 are increased (or decreased) by a factor $\alpha$.

The second stage 236 includes variable current generator 206, which provides a tail current to transistor pair 218, 220, and a complementary current generator 208, which provides a tail current to transistor pair 222, 224. When the current of generator 206 is increased by $\Delta I$, the current of generator 208 is decreased by $\Delta I$, and visa versa. The aggregate current generated by second-stage generators 206 and 208 is twice that generated by first stage generators 202 and 204 in the first stage 234. The inputs to the gates of transistors 218 and 222 is $V_{n-1}^+$ and the inputs to the gates of transistors 220 and 224 is $V_{n-1}^-$. The widths of the gates of transistors 220 and 222 are increased (or decreased) by a factor $\alpha$.

The first and second stages are inter-coupled to each other because output node 230 is coupled to an output of transistors 210, 214, 218, and 222, while the output node 232 is coupled to an output node of transistors 212, 216, 220 and 224. Output nodes 230 and 232 are respectively coupled to load devices 226 and 228. As noted above in connection with FIG. 1, these load devices can include passive and/or active circuits, depending on the application of the filter circuit. The load devices can alternatively represent a separate filter or amplification stage.

In operation, when viewed macroscopically, the first and second stages 234 and 236 function similarly to the first and second stages of the filter circuit of FIG. 1. Namely, the fact that the aggregate tail current set by the second-stage generators 206, 208 is twice that set by first-stage generators 202, 204 dictates that the current gain for inputs $V_{n-1}^+$ and $V_{n-1}^-$ will be twice that of inputs $V_n^+$, $V_n^-$. The filter circuit 200 thus provides output voltages $V_{out}^+$ at node 230 and $V_{out}^-$ at node 232. The output voltages will reflect a "weighting" of signals n and n−1 consistent with their relative current amplification, just as in the circuit of FIG. 1.

However, the circuit of FIG. 2 also removes or introduces offsets to or from the differential signals $V_n$ and $V_{n-1}$. This arises from the mismatching of the widths of the differential transistor pairs by the factor $\alpha$.

Consider the first stage 234 in an operating condition wherein $V_n^+ = V_n^-$. Also assume that the tail currents 202 and 204 are equal and the load impedances are equal. In such a configuration, the stage 234 provides a nominal offset that will appear at the output as $V_{out}^+ - V_{out}^- = V_{nominal}$ $$= \{[\alpha/(\alpha+1)]I + [1/(\alpha+1)]I\}Rload$$

$$- \{[\alpha/(\alpha+1)]I + [1/(\alpha+1)]I\}Rload \qquad (1) = 0.$$

Next, keeping the input voltages the same, if current 202 is increased and current 204 is decreased both by the same amount, namely $I_{202} + \Delta I$ and $I_{204} - \Delta I$, then $V_{out}^+$ changes to the following:

$$V_{out}^+ = \{[\alpha/(\alpha+1)][I_{202}+\Delta I] + [1/(\alpha+1)][I_{204\ -\Delta I}]\}RL \qquad (2)$$

Similarly, the new value of $V_{out}^-$ is given by:

$$V_{out}^- = \{[\alpha/(\alpha+1)][I_{204}-\Delta I] + [1/(\alpha+1)][I_{202\ +\Delta I}]\}RL \qquad (3)$$

Finally, the difference voltage $V_{out}^+ - V_{out}^-$ is given by:

$$V_{out}^+ - V_{out}^- = +[2(\alpha-1)/(\alpha+1)]\Delta I\ R_{load} \qquad (4)$$

Thus, increasing $I_{202}$ and decreasing $I_{204}$ resulted in a decrease in the difference output voltage as given in the expression above. This decrease is the offset forced by the change in tail currents. Now, if the tail currents are changed in the reverse direction, that is if $I_{202}$ is decreased and $I_{204}$ is increased by the same amount, then following an analysis similar to that above gives the following expression:

$$V_{out}^+ - V_{out}^- = -[2(\alpha-1)/(\alpha+1)]\Delta I\ R_{load} \qquad (5)$$

which is an offset in the output voltage that is opposite in polarity to that given by equation (4). Thus, this example illustrates how opposite polarity offsets may be obtained in proportion to a differential change in the tail currents. The net effect is that an offset dictated by $\Delta I$ and $\alpha$ is imposed upon or removed from the signals $V_n^+$, $V_n^-$ at the first stage 234.

This same effect is observed in the second stage 236 when current 206 is changed by $\Delta I$ and current 208 is changed by −ΔI. Accordingly, the offset dictated by ΔI and α is imposed or removed from the signals $V_{n-1}^+$, $V_{n-1}^-$ at the second stage 236.

The circuit 200 thus serves both as a FIR filter and as a variable offset amplifier. The differential signals $V_{n-1}$ and $V_n$ are weighted by the ratio between the average tail currents in the first and second stages. At the same time, offset is imposed upon the two differential input signal pairs $V_n^+$, $V_n^-$ and $V_{n-1}^+$, $V_{n-1}^-$.

Figure 3:
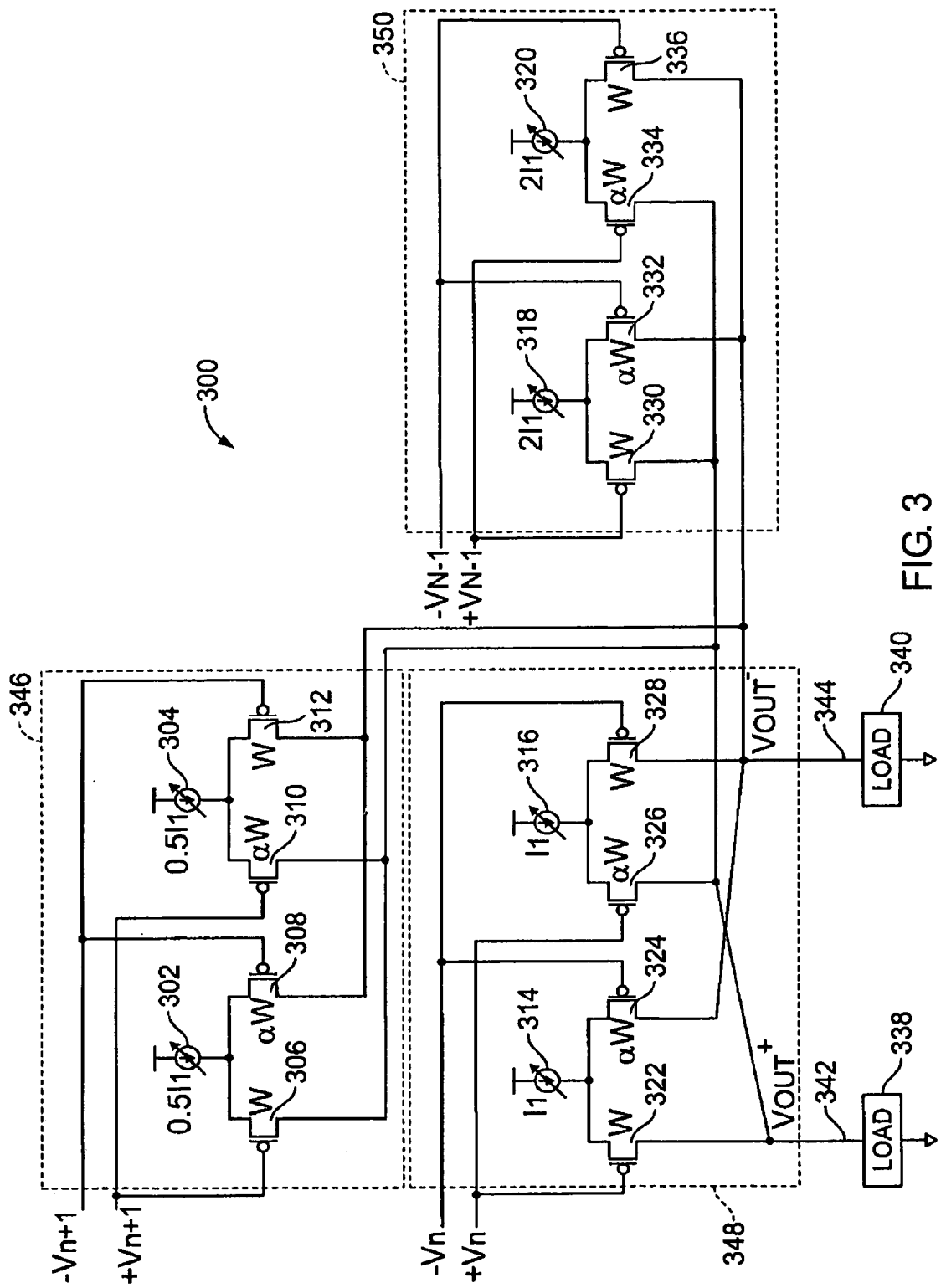
FIG. 3 is a schematic diagram of a three stage FIR filter embodiment adapted to compensate for amplifier offset.

FIG. 3 shows a three-stage filter circuit 300 that is similar to circuit 200 except that an additional stage 346 is added to include the differential signal $V_{n+1}$ in the filtration process. The first stage 348 includes variable current generator 314, which provides a tail current to transistor pair 322, 324, and a complementary current generator 316, which provides a tail current to transistor pair 326, 328. When the current of generator 314 is increased by ΔI, the current of generator 316 is decreased by ΔI, and visa versa. The inputs to the gates of transistors 322 and 326 is $V_n^+$ and the inputs to the gates of transistors 324 and 328 is $V_n^-$. The widths of the gates of transistors 324 and 326 are increased (or decreased) by a factor α.

The second stage 350 includes variable current generator 318, which provides a tail current to transistor pair 330, 332, and a complementary current generator 320, which provides a tail current to transistor pair 334, 336. When the current of generator 318 is increased by ΔI, the current of generator 320 is decreased by ΔI, and visa versa. The average current generated by second-stage generators 318 and 320 is twice that generated by first stage generators 314 and 316 in the first stage 348. The inputs to the gates of transistors 330 and 334 is $V_{n-1}^+$ and the inputs to the gates of transistors 332 and 336 is $V_{n-1}^-$. The widths of the gates of transistors 332 and 334 are increased (or decreased) by a factor α.

The third stage 346 includes variable current generator 302, which provides a tail current to transistor pair 306, 308, and a complementary current generator 304, which provides a tail current to transistor pair 310, 312. When the current of generator 302 is increased by ΔI, the current of generator 304 is decreased by ΔI, and visa versa. The average current generated by third-stage generators 302 and 304 is half that generated by first stage generators 314 and 316 in the first stage 348. The input to the gates of transistors 306 and 310 is $V_{n+1}^+$ and the input to the gates of transistors 308 and 312 is $V_{n+1}^-$. The widths of the gates of transistors 308 and 310 are increased (or decreased) by a factor α.

The first, second and third stages are inter-coupled to each other because output node 342 is coupled to an output of transistors 306, 310, 322, 326, 330 and 334, while the output node 344 is coupled to an output node of transistors 308, 312, 324, 328, 332, and 336. Output nodes 342 and 344 are respectively coupled to load devices 338 and 340. As noted above in connection with FIGS. 1 and 2, these load devices can include passive and/or active circuits, depending on the application of the filter circuit, and the load devices can alternatively represent a separate filter or amplification stage.

The operation of the circuit 300 is similar to that of circuit 200 except that differential signal $V_{n+1}$ is weighted and factored into the output signals 342, 344. In this embodiment, $V_{n+1}$ is afforded half the weight of signal $V_n$ and a quarter the weight afforded signal $V_{n-1}$. The operation of circuit 300 also differs in that offset is also imposed upon the differential input signal pair $V_{n+1}^+$, $V_{n+1}^-$, as dictated by ΔI and α.

As can be readily appreciated from the foregoing, any desired number of stages can be added to permit filtration of additional data points. Similarly, any desired weighting factor can be applied amongst sequential data points $V_{n-1}$, $V_n$, $V_{n+1}$, et cetera, by appropriate selection of tail currents. Any desired offset can be applied to each differential input pair by appropriate selection of ΔI and α.

Figure 4:
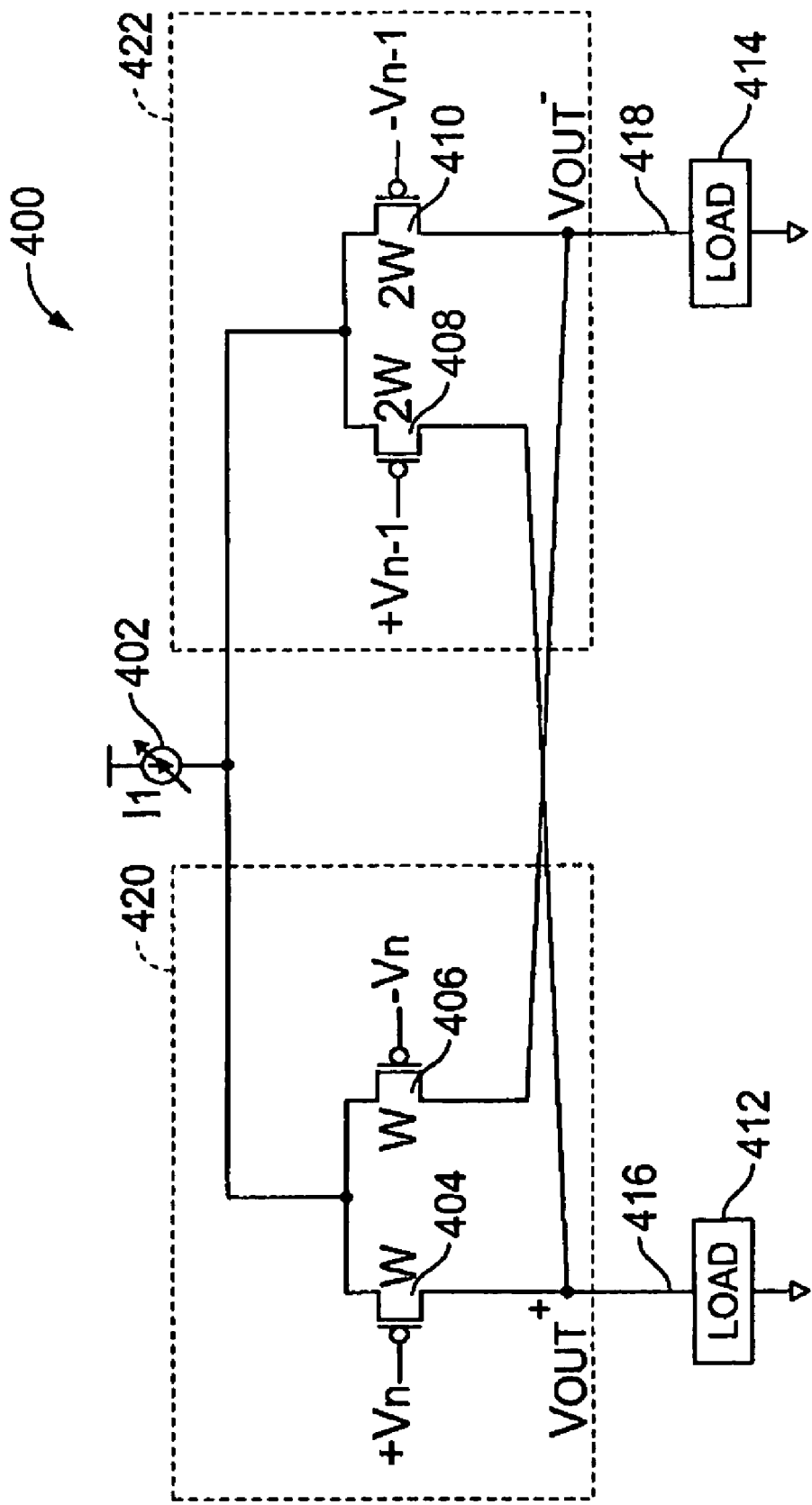
FIG. 4 is a schematic diagram of a two stage FIR filter having a single variable current source.

The circuit of FIG. 4 reflects another modification to the filter circuit of FIG. 1. Filter circuit 400 operates similarly to circuit 100 except that the tail current of second stage 422 is controlled by varying the widths of the channels of the second stage transistors instead of varying an independent current source.

Current source 402 feeds both the first stage differential transistor pair 404, 406 and second stage transistor pair 408, 410. Circuit elements 404 to 414 and their connections are similar to elements 106 to 120 in FIG. 1 and need not be explained further herein, except to say that the widths of first stage differential transistor pair 404, 406 are half that of the second stage transistor pair 408, 410.

In operation, the first and second stages 420 and 422 function similarly to the first and second stages of the filter circuit of FIG. 1. Namely, the fact that the aggregate tail current set by the width of second-stage transistors 408, 410 is twice that set by the width of first-stage transistors 404, 406 dictates that inputs $V_{n-1}^+$ and $V_{n-1}^-$ will be amplified twice as much as inputs $V_n^+$, $V_n^-$. The filter circuit 400 thus provides output voltages $V_{out}^+$ at node 416 and $V_{out}^-$ at node 418. The output voltages will reflect a "weighting" of signals n and n-1 consistent with their relative amplification, just as in the circuit of FIG. 1.

Figure 5:
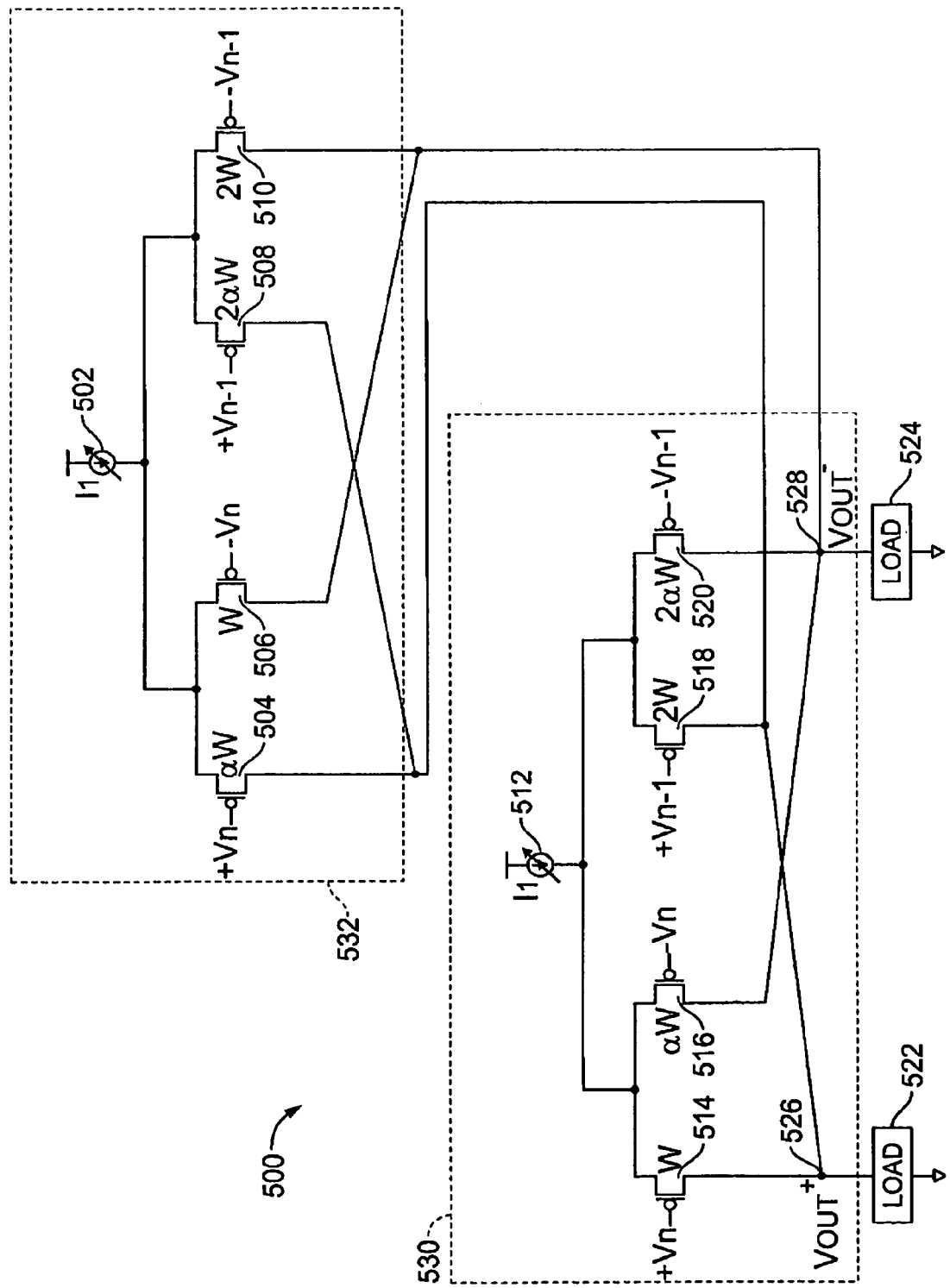
FIG. 5 is a schematic diagram of a two stage FIR filter having a single variable current source and adapted to compensate for amplifier offset.

The circuit of FIG. 5 reflects a modified version of the circuit of FIG. 4 that permits variable offset control. The circuit of FIG. 5 is comprised of two sub-circuits 530, 532 having the same basic topology as circuit 400 inter-coupled to one another in the same fashion discussed above. The only difference between each of the sub-circuits 530, 532 and the circuit 400 is that widths of the certain of the differential transistor pairs are adjusted by factor α. The currents fed into the sub-circuits 530, 532 are complimentary in the sense that, when the current of generator 512 is increased by ΔI, the current of generator 502 is decreased by ΔI, and visa versa. The remaining aspects of components 502-528 are similar to the parallel components 402-418 already described above in connection with FIG. 4.

In operation, the sub-circuits 530 and 532 of filter circuit 500 function similarly to filter circuit 400. Differential signal $V_{n-1}$ is given twice the weight of signal $V_n$ before it is summed with $V_n$ at output nodes 526, 528. However, the circuit 500 also removes or introduces offsets to or from the differential signals $V_n$ and $V_{n-1}$ as dictated by ΔI and α, and the teachings set forth above. The factor α applied at transistors 504 and 516 controls the relative offset applied to the differential signal $V_n$ and the offset factor α applied at transistors 508 and 520 controls the relative offset applied to the differential signal $V_{n-1}$.

Many other modifications can be made to the circuits of FIGS. 1-5 in accordance with the teachings set forth herein. For instance, the current differentials can be provided by digitally controlled current sources. A single current source may be tapped in various locations to provide varied tail currents. The relative location of the loads and current sources can be switched by tying the loads to Vcc and implementing current sinks. Non-integer weighting factors and offset factors α can be realized by appropriate manipulation of current sources, transistor widths, passive circuit element parameters, or any other parameter that affects output node voltage in a particular circuit topology. Furthermore, negative weighting factors can be advantageously provided by switching the input terminals (e.g. switching $V_n^+$ and $V_n^-$ such that they bias the other FET in the differential pair). The offset factor can be realized by altering one or both of the channel widths or lengths of the differential transistor pairs. Similarly, the weighting factor can be realized by altering one, some or all of the channel widths or lengths of the inter-coupled transistors. The weighting factor can also be realized by altering one, some, or all of the tail currents feeding into each stage. The number of data points sampled (N) and the number of stages can be selected to obtain optimum filtration while minimizing hardware cost. The filter circuits of the instant invention can be integrated into an analog filtering stage, which additionally reduces complexity and increases operating speed. Additional devices such as common mode feedback devices can be advantageously added to the filter circuits of the instant invention. By appropriate selection of the loads, the filter can additionally provide a desired amplification of the differential input signals. Moreover, the range in which the relationship between $V_{in}$ and $I_{out}$ is linear can be advantageously broadened by adding degenerating resistances between the current sources and differential pairs. Many other such modifications can be readily made to adapt the instant control circuit to other circuit environments.

Figure 6:
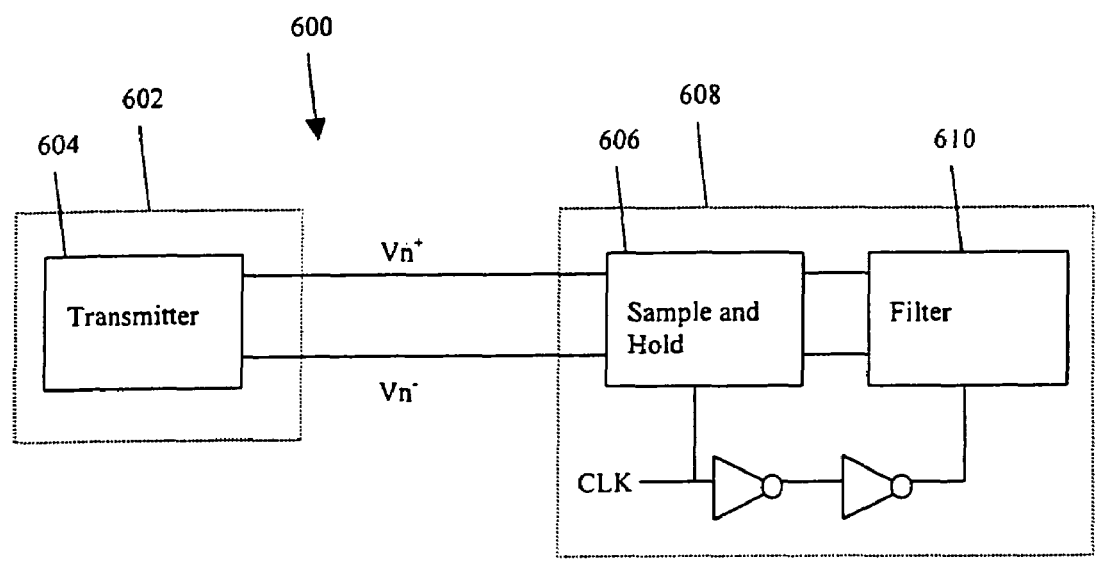
FIG. 6 is a schematic diagram a communications system including an FIR filter.

FIG. 6 shows a communications system 600 having the filter of FIGS. 1-5 in a communications application. The transmission end of the signal to be sensed may reside on a separate integrated circuit die or separate circuit board, for example, as depicted by block 602 having a transmitter 604 with differential outputs $V_n^+$ and $V_n^-$. These differential output signals are received by a sample-and-hold circuit 606 that may reside, as shown in FIG. 6, on a separate integrated circuit die or separate board as depicted by block 608. A clock signal CLK determines the timing of when the differential signal is sampled, and a delayed clock signal determines the timing of when the sampled-and-held differential signal is filtered by circuit 610.

Aspects of the invention provide for one or more of the following advantages. In selected embodiments, the invention provides a filter circuit that serves simultaneously as an FIR filter and a variable offset amplifier. In certain embodiments, the digital signal processing requirements are significantly reduced in comparison to previous designs. In some embodiments, the circuit has improved common mode rejection ration and power supply rejection ration compared to other designs of such circuits, which permits sampling and filtration of an increased number of differential input data points. In still other embodiments, the filter can be integrated into an analog filtering stage, as noted above, which in turn reduces complexity and increases operating speed.

A number of embodiments have been described. Nevertheless, it will be understood that various modifications may be made without departing from the spirit and scope of the invention. Accordingly, other embodiments are within the scope of the following claims.

What is claimed is:

1. A signal processing circuit, the circuit comprising:
   a first differential amplifier that receives a first pair of samples of a first input signal and a second input signal taken at a first time, the first differential amplifier amplifying by a first gain the first pair of samples to generate a first output signal and a second output signal, respectively;
   a second differential amplifier that receives a second pair of samples of the first input signal and the second input signal taken at a second time, the second differential amplifier amplifying by a second gain the second pair of samples to generate a third output signal and a fourth output signal, respectively;
   means for summing the first and the third output signals; and
   means for summing the second and the fourth output signals,
   wherein the second gain is independently controllable relative to the first gain.

2. The signal processing circuit of claim 1, wherein the first and second gains are responsive to a first control signal and a second control signal, respectively.

3. The signal processing circuit of claim 1, wherein the first gain is controllable by modulating a tail current in the first differential amplifier.

4. The signal processing circuit of claim 1, wherein the second gain is controllable by modulating a tail current in the second differential amplifier.

5. The signal processing circuit of claim 1, wherein the first and second gains are controllable by modulating controlled current sources or sinks in the corresponding first and second differential amplifiers.

6. The signal processing circuit of claim 1, wherein each of the first and second differential amplifiers comprises a controllable current source or sink to set the first and second gains, respectively.

7. The signal processing circuit of claim 1, wherein a tail current in the first differential amplifier circuit is different than a tail current in the second differential amplifier circuit.

8. The signal processing circuit of claim 1, wherein the first and second gains differ according to different channel widths between the first and second differential amplifiers.

9. The signal processing circuit of claim 1, wherein the first and second gains are determined according to one or more differences in channel widths between the first and second differential amplifiers and according to modulation of one or more controlled current sources or sinks in the first and second differential amplifiers.

10. The signal processing circuit of claim 9, wherein each of the one or more controlled current sources or sinks is modulated according to a corresponding control signal.

11. The signal processing circuit of claim 1, wherein the first and second differential amplifiers comprise p-channel MOSFETs.

12. The signal processing circuit of claim 1, wherein the first and second input signals comprise a differential voltage signal.

13. The signal processing circuit of claim 1, wherein the first and second input signals are sampled and held at the first and second sample times to generate signals for biasing transistors in the first and second differential amplifiers, respectively.

14. A finite impulse response (FIR) filter comprising the signal processing circuit of claim 1.

15. The signal processing circuit of claim 1, further comprising a third differential amplifier that receives a third pair of samples of the first input signal and the second input signal taken at a third time, the third differential amplifier amplifying by a third gain the third pair of samples to generate a fifth output signal and a sixth output signal, respectively;
   wherein the means for summing the first and the third output signals is further for summing the fifth output signal, the means for summing the second and the fourth output signals is further for summing the sixth output signal, and the third gain is independently controllable relative to the first and second gains.

16. The signal processing circuit of claim 15, wherein the first, the second, and the third gains are responsive to a first, a second, and a third control signal, respectively.

17. A signal processing circuit, the circuit comprising:
a first differential amplifier that receives a first pair of samples of a first input signal and a second input signal taken at a first time, the first differential amplifier amplifying by a first gain the first pair of samples to generate a first output signal and a second output signal, respectively;
a second differential amplifier that receives a second pair of samples of the first input signal and the second input signal taken at a second time, the second differential amplifier amplifying by a second gain the second pair of samples to generate a third output signal and a fourth output signal, respectively;
means for summing the first and the third output signals; and
means for summing the second and the fourth output signals,
wherein the second gain is independently controllable relative to the first gain, the first and second gains are responsive to a first control signal and a second control signal, respectively, and the first and second input signals comprise a differential voltage signal.

18. The signal processing circuit of claim 17, wherein the first and second input signals are sampled and held at the first and second sample times to generate signals for biasing transistors in the first and second differential amplifiers, respectively.

19. A filtering method, comprising:
receiving a first and a second pair of samples of a first input signal and a second input signal, the first and second pairs of samples being samples of the first and second input signals at a first time and a second time, respectively;
differentially amplifying the first pair of samples by a first gain to generate a first output signal and a second output signal;
differentially amplifying the second pair of samples by a second gain to generate a third output signal and a fourth output signal;
summing the first and the third output signals to generate a first filtered output signal;
summing the second and the fourth output signals to generate a second filtered output signal; and
controlling the first and second gains independently.

20. The method of claim 19, further comprising sampling and holding the first and second input signals at the first and second times to generate the first and second pairs of samples, respectively.

* * * * *